(12) United States Patent
Ju

(10) Patent No.: US 7,854,622 B1
(45) Date of Patent: Dec. 21, 2010

(54) ELECTRICAL CONNECTING DEVICE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/844,202

(22) Filed: Jul. 27, 2010

Related U.S. Application Data

(62) Division of application No. 12/726,076, filed on Mar. 17, 2010.

(51) Int. Cl.
*H01R 13/625* (2006.01)
(52) U.S. Cl. ...................................... 439/342
(58) Field of Classification Search ................. 439/342, 439/259, 70, 83, 264, 268
See application file for complete search history.

(56) References Cited

U.S. PATENT DOCUMENTS 7,572,136 B2 * 8/2009 Liao ........................... 439/342
7,753,707 B1 * 7/2010 Ju ............................... 439/342

* cited by examiner

*Primary Examiner*—Phuong K Dinh
(74) *Attorney, Agent, or Firm*—Rosenberg, Klein & Lee

(57) ABSTRACT

The present invention discloses an electrical connecting device adapted to receive a chip unit. The electrical connecting device includes an insulation base, a terminal set, a circuit board, a cover and a driving mechanism. The insulation base is formed with a terminal area and a first pierced hole. The terminal set is disposed correspondingly in the terminal area. The circuit board is disposed under the insulation base. The circuit board is formed with a pad area, which is disposed correspondingly to and under the terminal area for the terminal set to be soldered on. The circuit board is formed with a through hole corresponding to the first pierced hole. The cover is horizontally and slidably covering the insulation base. The driving mechanism at least has a metal bushing covered into the first pierced hole and the through hole. The driving mechanism further has a cam, which has a driven portion extending to form a first cylinder into the first pierced hole. The first cylinder is jointed into the metal bushing correspondingly. A second cylinder which is off-centered with respect to the first cylinder is formed between the driven portion and the first cylinder and entering the second pierced hole.

12 Claims, 7 Drawing Sheets

ELECTRICAL CONNECTING DEVICE

RELATED APPLICATIONS

This application is a Divisional patent application of co-pending application Ser. No. 12/726,076, filed on 17 Mar. 2010. The entire disclosure of the prior application Ser. No. 12/726,076, from which an oath or declaration is supplied, is considered a part of the disclosure of the accompanying Divisional application and is hereby incorporated by reference.

BACKGROUND OF THE INVENTION

1. Field of the Invention

The present invention relates generally to an electrical connecting device, and more particularly, to an electrical connecting device adapted to enhance electrical connection.

2. Description of the Prior Art

With the trend of the electronic device developed to be thin, light-weighted, miniaturized and portable, there is a need to place more terminal sets in a limited area on the electrical connecting device to correspond to increased pins placed on a central processor unit.

FIG. 1 illustrates an electrical connecting device disclosed in the China Patent Publication No. CN2833952. The electrical connecting device comprises a first base a, a first driving pin b, a cam c and a frame board d disposed on the front side of the first base a. The first base a is formed with four receiving holes a1 and a shaft hole a2. The first driving pin b is formed with a driving portion b1 and a shaft portion b2. The cam c is formed with a driven hole c1. The shaft portion b2 is able to cooperate with the driven hole c1, so that rotating the driving portion b1 is able to drive the cam c to rotate. The middle portion of the frame board d is formed with a bulging part d1, of which a center through hole d2 is formed in the center part. The frame board d further extends downward to form four foot portions d3. Each of the foot portions d3 is able to cooperate with one of the receiving holes a1, that is, the frame board d is firmly connected and disposed on the first base a.

When assembling the electrical connecting device, the first step is to dispose the cam c on the front side of the first base a and to have the driven hole c1 corresponding to the shaft hole a2. Furthermore, dispose the frame board d on the cam c to have the cam c received between the bulging part d1 and the first base a. The center through hole d2 is disposed correspondingly to the driven hole c1 and the shaft hole a2. Each of the foot portion d3 passes through one of the receiving holes a1 to firmly connect and position the frame board d on the first base a. Finally, pass the shaft portion b2 through the center through hole d2, the driven hole c1 and the shaft hole a2. In practical operation, the cam c can be driven to rotate simply by rotating the driving portion b1 with a tool.

The disadvantage of the electrical connecting device will be described in the following details. With the reaction force exerted on the pins of the central processing unit by the terminal set, the reaction force is delivered to the frame board d and the first base a solely by the shaft portion b2. Although the frame board d reinforces the first base a to a certain extent, the frame board d is positioned on the first base a but not on an electrical circuit board (not shown in the drawing). Therefore, no reaction force can be transferred away through the electrical circuit board (not shown in the drawing), which may further result in bump forming on the front side of the first base a.

Another electrical connecting device is disclosed in the specification and drawings of the U.S. Patent Application No. US20050054754. The electrical device comprises a second driving pin and a second base. The second base has a fastening metal sheet disposed on the front side thereof and a base hole disposed thereon correspondingly to a shaft portion disposed on the second driving pin.

The second base has the fastening metal sheet disposed on the front side thereof to reinforce the second base, which solves the problem of the bump that may form on the front side of the second base due to increasing reaction force from the terminal sets. However, because the shaft portion is directly disposed inside the base hole, the reaction force exerted to the base hole by the shaft portion increases with the increasing force that rotates the second driving pin. Therefore, without any reinforcement provided to the base hole, the shaft portion may wear the surrounding base hole and causes the base hole to expand. As a result, loosening will occur in the coordination between the shaft portion and the base hole, which will interfere on the electrical connection of the electrical connecting device.

Therefore, there is a need to design a new electrical connecting device to overcome the defection described hereinabove.

SUMMARY OF THE INVENTION

The objective of the present invention is to provide an electrical connecting device which can prevent reaming and bulge for the insulation base.

To this end, the core technology applied in the present invention comprises:

An electrical connecting device is adapted to receive a chip unit, while the chip unit comes with a plurality of pins disposed on a bottom of the chip unit, and the electrical connecting device includes an insulation base, a terminal set, a circuit board, a cover and a driving mechanism. The insulation base is formed with a terminal area and a first pierced hole. The terminal set is disposed correspondingly on the terminal area. The circuit board is disposed under the insulation base. The circuit board is formed with a pad area, which is disposed correspondingly to and under the terminal area for the terminal set to be soldered on. The circuit board is formed with a through hole corresponding to the first pierced hole. The cover is horizontally and slidably covering the insulation base and adapted to receive the chip unit. The cover is formed with a plurality of opening holes corresponding to the terminal area for the pins to pass through and electrically connected to the terminal set. The cover is further formed with a second pierced hole. The driving mechanism has a metal bushing covered into the first pierced hole and the through hole. The driving mechanism further has a cam, which has a driven portion extending to form a first cylinder into the first pierced hole. The first cylinder is jointed into the metal bushing correspondingly. A second cylinder which is off-centered with respect to the first cylinder is formed between the driven portion and the first cylinder and entering the second pierced hole.

An electrical connecting device comprises an insulation base, a terminal set, a cover, a circuit board and a driving mechanism. The insulation base is formed with a first pierced hole. The terminal set is disposed correspondingly in the insulation base. The cover horizontally and slidably covers the insulation base and is formed with a second pierced hole correspondingly to the first pierced hole. The circuit board is disposed under the insulation base for the terminal set to be soldered on, and is formed with a through hole correspondingly to the first pierced hole. The driving mechanism at least has a cam. The cam enters the second pierced hole, the first pierced hole and the through hole in a consecutive order.

Compared to the state of the art, the present invention has the following advantages:

1. By forming the through hole on the circuit board correspondingly to both the first pierced hole and the second pierced hole, the cam can enter the second pierced hole, the first pierced hole and the through hole. Because the terminal sets are soldered on the circuit board and the pins of the chip unit are inserted into the insulation base to connect to the terminal sets, when the cam drives the cover to move along the insulation base, the pins will exert an acting force to the terminal sets. According to the law of interaction for a force, the pins will also experience a reaction force from the terminal sets. However, because the cam enters the through hole, a part of the reaction force from the terminal sets is transferred through the cam to the circuit board. Therefore, the bulging effect occurred in the front side of the insulation base is prevented and hence the stableness of the electrical connection of the electrical connecting device is enhanced.

2. The driving mechanism further comprises the metal bushing. The metal bushing is disposed inside the first pierced hole and the through hole, while the first cylinder of the cam is fit into the metal bushing. With the increasing force which rotates the cam, most of the reaction force from the terminal sets will be exerted on the metal bushing and be transferred to the circuit board by the metal bushing. Therefore wearing of the first pierced hole disposed on the insulation base and loosening occurred in the coordination between the first cylinder and the first pierced hole caused by the expansion of the first pierced hole are prevented, which will further enhance the stableness of the electrical connection of the electrical connecting device.

The advantage and spirit of the invention may be understood by the following recitations together with the appended drawings.

BRIEF DESCRIPTION OF THE APPENDED DRAWINGS

DETAILED DESCRIPTION OF THE INVENTION

The electrical connecting device of this invention will be further described in following detailed description of the embodiment and drawings.

Figure 1:
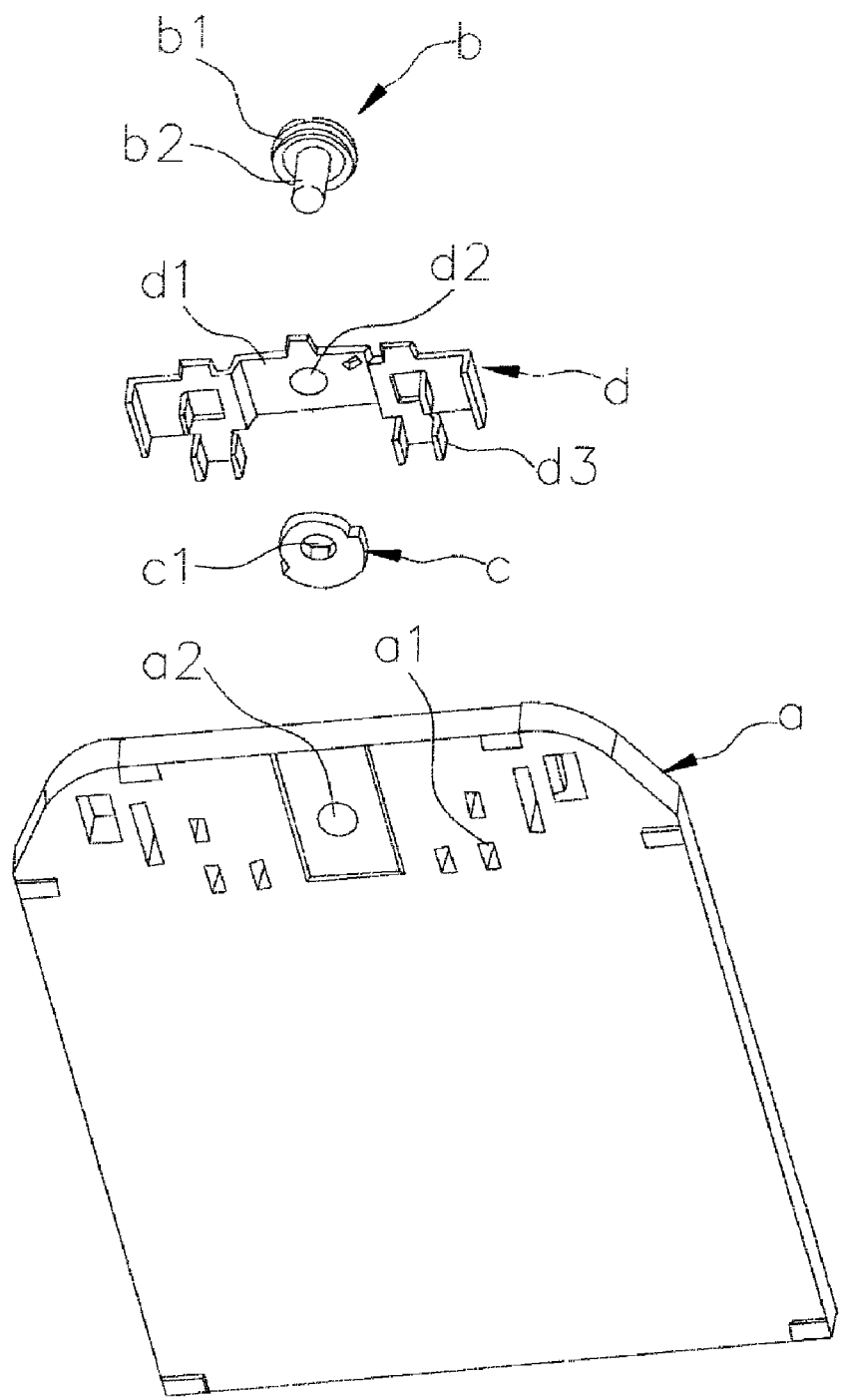
FIG. 1 is an exploded view of the conventional electrical connecting device.
Figure 2:
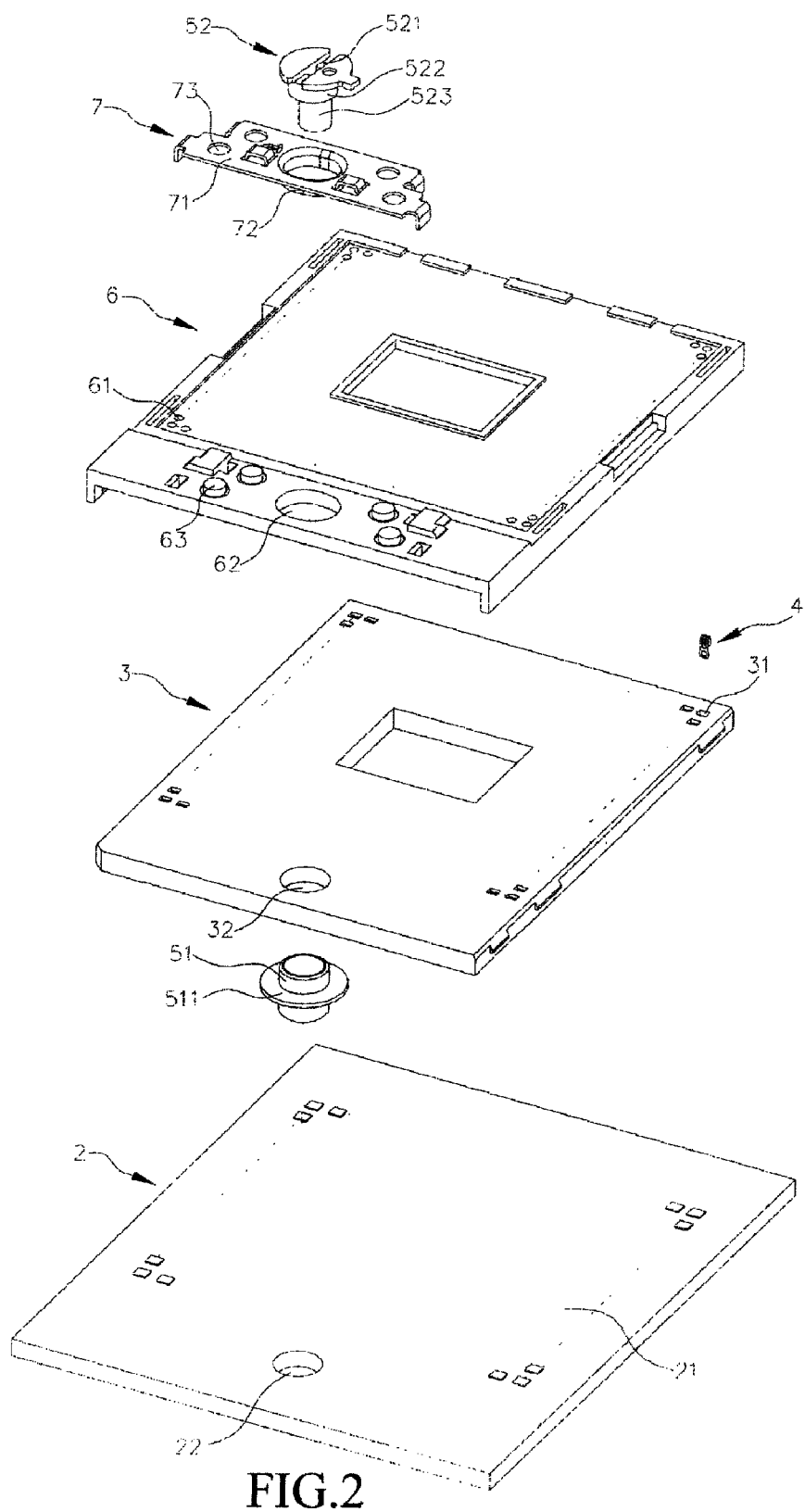
FIG. 2 is an exploded view of the electrical connecting device of this invention.

Referring to FIG. 2, the electrical connecting is configured to provide the electrical connection between the chip unit 1 and the circuit board 2. The electrical connecting device comprises an insulation base 3 disposed on the circuit board 2, a plurality of terminal sets 4 (partially shown in the figure) fixed inside the insulation base 3, a driving mechanism 5 cooperating with the insulation base 3 and the terminal sets 4, a cover 6 horizontally and slidably covering on the insulation base 3 and a reinforcement element 7 disposed on the cover 6.

Referring to FIG. 2, a terminal area 31 is disposed on the insulation base 3. The terminal area 31 corresponds and receives the terminal sets 4. The terminal sets 4 disposed inside the terminal area 31 are electrically connected to the circuit board 2. A first pierced hole 32 is further formed on the insulation base 3.

Referring to FIG. 2, the circuit board 2 is disposed under the insulation base 3. The circuit board 2 is formed with a pad area 21 disposed correspondingly to and under the terminal area 31 for the terminal sets 4 to be soldered on. The circuit board 2 is further formed with a through hole 22 correspondingly to the first pierced hole 32.

With reference to FIGS. 2 to 5, the driving mechanism 5 has a metal bushing 51 fixed on the insulation base 3. The metal bushing 51 joins into the first pierced hole 32 and is extending into the through hole 22. The metal bushing 51 has a plate body 511 extending in the lateral direction from the lateral side of the metal bushing 51. The plate body 511 is disposed between the insulation base 3 and the circuit board 2, while a recess 33 is formed on the bottom of the insulation base 3 to receive the plate body 511. Furthermore, the driving mechanism 5 has a cam 52, which comprises a driven portion 521. The driven portion 521 extends to form a second cylinder 522, while the second cylinder 522 further extends to form a first cylinder 523. The first cylinder 523 is off-centered with respect to the second cylinder 522. The second cylinder 522 passes through the reinforcement element 7 and the cover 6 orderly. The first cylinder 523 passes through the first pierced hole 32, the metal bushing 51 and the through hole 22. The second cylinder 522 is installed inside the cover 6 and rotatably cooperates with the cover 6. The driven portion 521 is disposed on the surface of the reinforcement element 7 for a driving tool (not shown in the figure) to drive.

Figure 3:
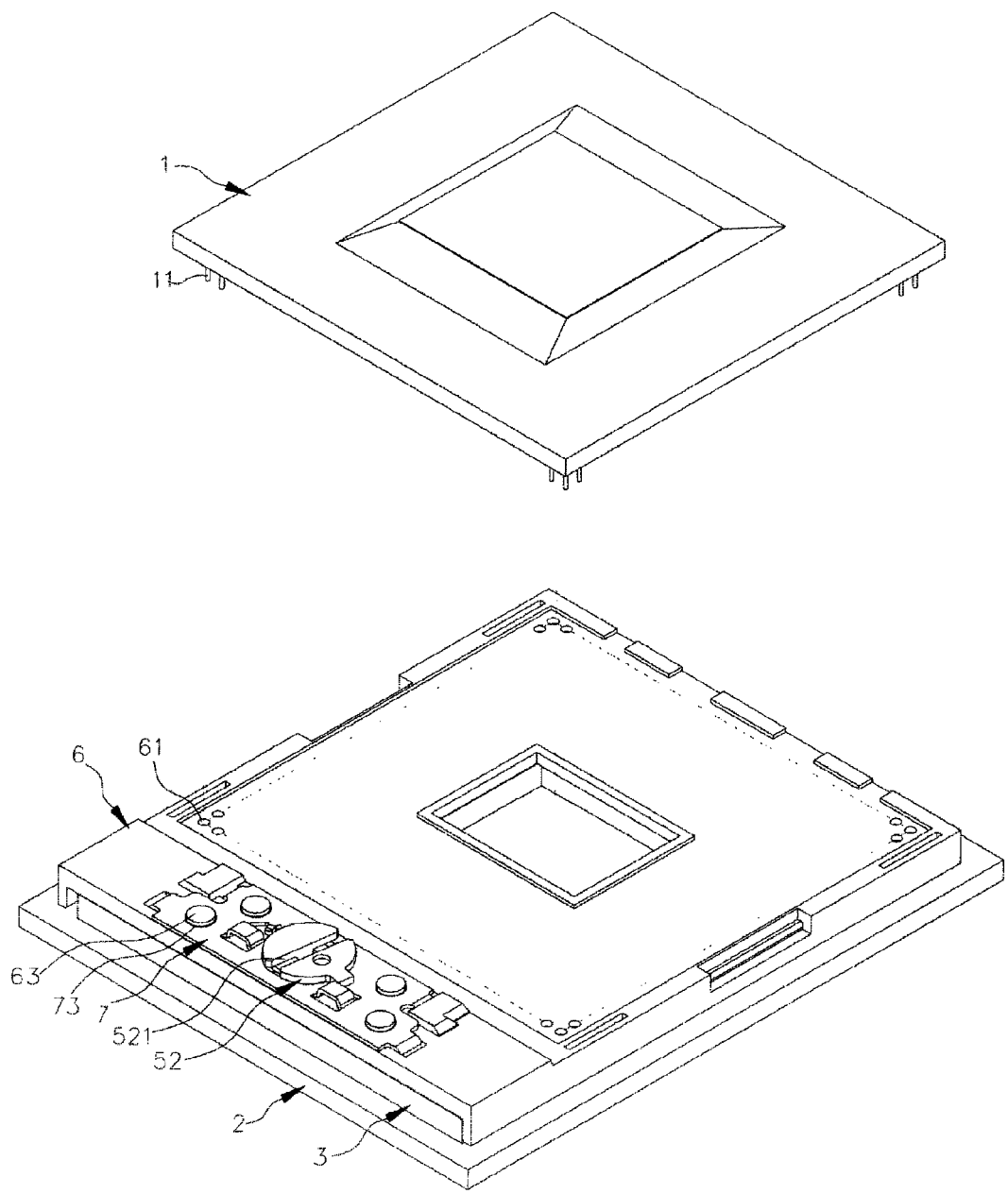
FIG. 3 is an assembly view of the electrical connecting device of this invention before the chip unit is installed to the electrical connecting device.

Referring to FIG. 2 and FIG. 3, the cover 6 horizontally and slidably covers the insulation base 3 and is configured to receive the chip unit 1. The cover 6 is formed with a plurality of opening holes 61 (partially shown in the figure) corresponding to the terminal areas 31 for a plurality of the pins 11 (partially shown in the figure) of the chip unit 1 to pass through and to be electrically connected to the terminal sets 4 (partially shown in the figure). Furthermore, the cover 6 is formed with a second pierced hole 62, corresponding to the first pierced hole 32, and four fixing pins 63. Each two of the fixing pins 63 are disposed correspondingly to each other on the opposite side of the second pierced hole 62.

Referring to FIG. 2, the reinforcement element 7, which is a metal plate, is disposed on the cover 6 to reinforce the strength of the cover 6. The reinforcement element 7 has a sustaining plate 71, which is disposed between the driven portion 521 and the cover 6, for the driven portion 521 to lean against. The sustaining plate 71 extends downward to form a sleeve 72, which enters the second pierced hole 62. The second cylinder 522 is disposed inside the sleeve 72, while the sleeve 72 is adapted to be pushed by the second cylinder 522. Furthermore, four fixing holes 73 are formed on the reinforcement element 7 correspondingly to the four fixing pins 63 on the cover 6. In other embodiment, the reinforcement 7 may include more or less than four said fixing holes 73, which correspond and cooperate with more or less than four said fixing pins 63.

Figure 4:
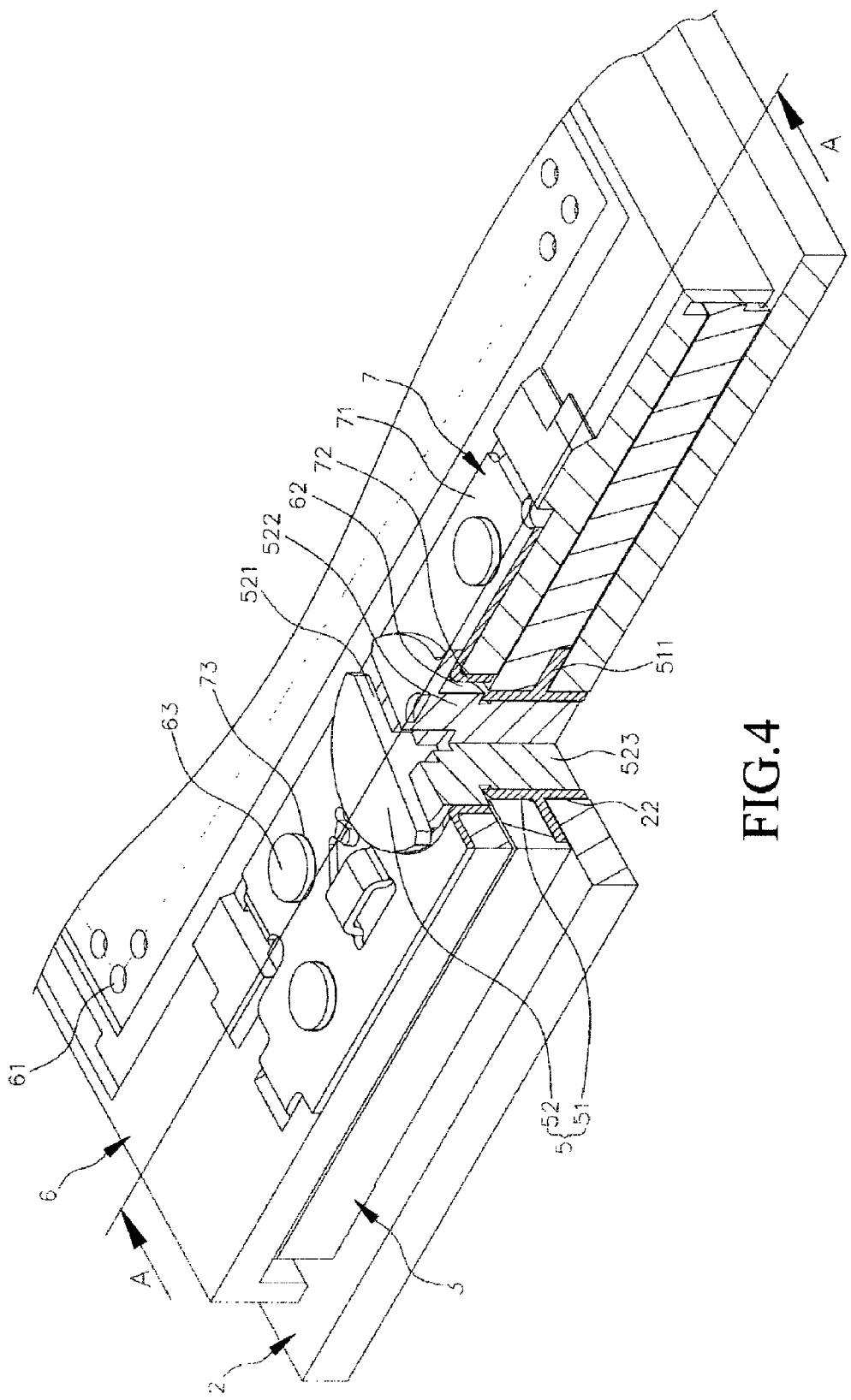
FIG. 4 is a partial cross-sectional view of the electrical connecting device of this invention.
Figure 5:
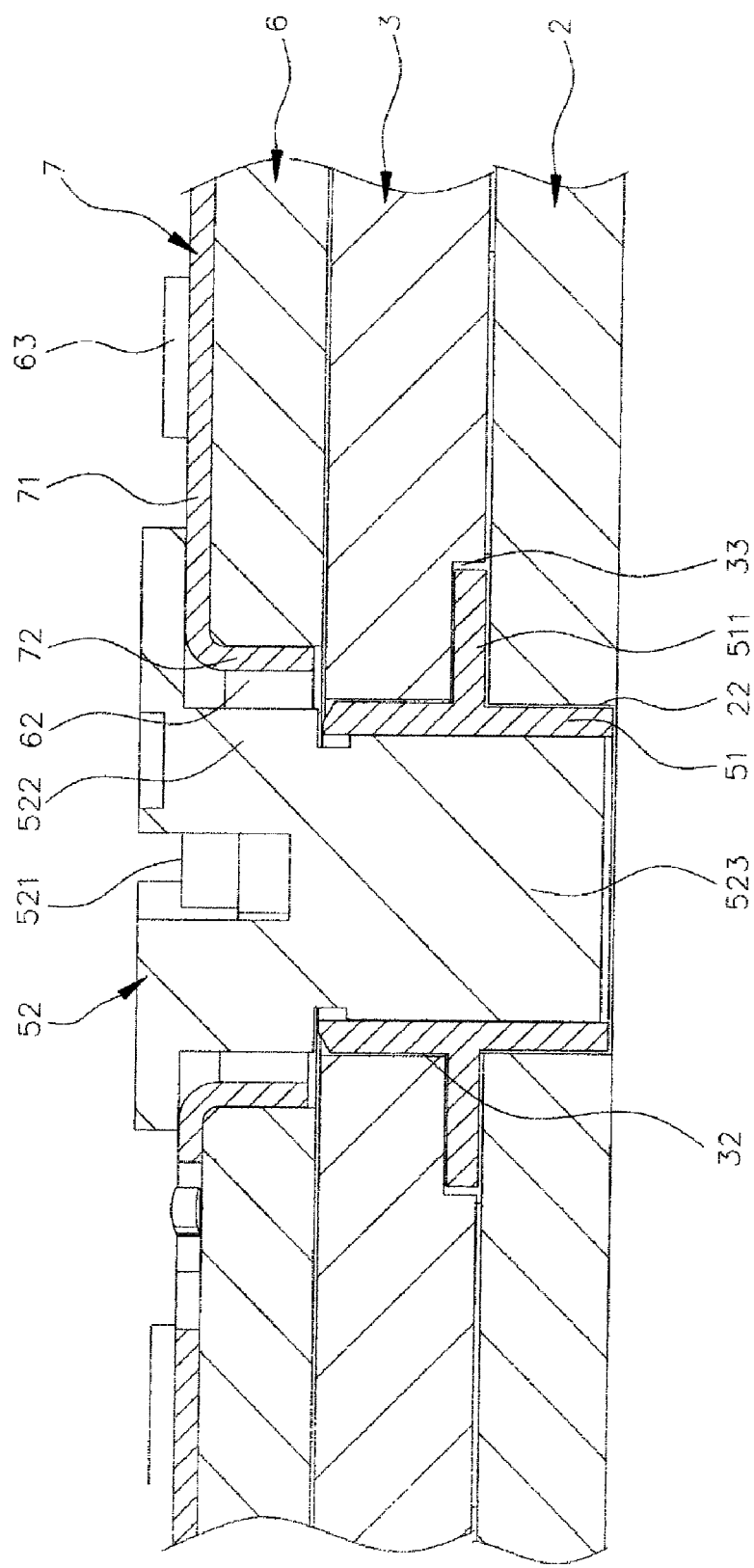
FIG. 5 is a cross-sectional view along A-A direction in FIG. 4.

With reference from FIG. 3 to FIG. 5, the first step in assembling is to fix the metal bushing 51 onto the insulation base 3 in such a way that the metal bushing 51 is covered into the first pierced hole 32, while the plate body 511 is received in the recess 33.

Next, dispose the reinforcement element 7 on the cover 6 and have the sleeve 72 disposed into the second pierced hole 62.

Then, disposed the cover 6 on the insulation base 3 and have the second pierced hole 62 corresponding to the first pierced hole 32.

Then, pass the cam 52 through the sleeve 72, the second pierced hole 62, the metal bushing 51, the first pierced hole 32 and the through hole 22 orderly. The first cylinder 523 joins in the metal bushing 51 and penetrates into the through hole 22. The second cylinder 522 is disposed inside the sleeve 72 and rotatably cooperates with the second pierced hole 62. The driven portion 521 is held on the cover 6 and is disposed on the top surface of the reinforcement element 7, that is, the reinforcement element 7 is disposed between the driven portion 521 and the cover 6. By this way, the assembly of the electrical connecting device is completed. At this moment, the metal bushing 51 is disposed between the inner surface of the first pierced hole 32 and the first cylinder 523.

Finally, dispose the chip unit 1 on the cover 6 to have the pins 11 of the chip unit 1 inserted into the corresponding opening hole 61 respectively and penetrate into the insulation base 3.

When operating, by rotating the driven portion 521 with simply a driving tool (not shown in the figure), such as a screwdriver, the second cylinder 522 is able to push the cover 6 to slide and the cam 52 rotated by the driving tool (not shown in the figure) drives the cover 6 to move between an opened position and a closed position. When the cover 6 is at the open position, the pins 11 contact the terminal sets 4 (that is, zero-contact state). When the cover 6 is at the closed position, the pins 11 are electrical conducted to the terminal sets 4. At this very moment when the pins 11 electrically conducted to the terminal sets 4, the pins 11 exert an acting force on the terminal sets 4, and meanwhile the pins 11 also experience a reaction force applied by the terminal sets 4. Moreover, because the pins 11 pass through the opening holes 61 of the cover 6 while the second cylinder 522 interacts with the cover 6, the reaction force will apply on the second cylinder 522. Furthermore, the first cylinder 523 is extending from the second cylinder 522, that is, the first cylinder 523 experiences a reaction force with equal amount and in opposite direction comparing to the second cylinder 522. In addition, the first cylinder 523 is covered into the metal bushing 51, so the reaction force further applies on the metal bushing 51. Yet, because the metal bushing 51 is disposed between the insulation base 3 and the circuit board 2, a part of the reaction force of the plurality of terminal sets 4 exerting on the metal bushing 51 is borne by the metal bushing 51 and is transferred to the circuit board 2. As a result, the reaction force borne by the insulation base 3 is relieved, thereby preventing the bulging effect appear in the front side of the insulation base 3 and enhancing the stableness of the electrical connection of the electrical connecting device.

Furthermore, because the first cylinder 523 extends into the metal bushing 51, direct contact between the first cylinder 523 and the first pierced hole 32 is prevented. When the force rotating the cam 52 is getting greater, most of the reaction force of the terminal sets 4 is applied on the metal bushing 51 and further applied to the circuit board 2 through the metal bushing 51. Therefore, wearing of the first pierced hole 32 is prevented and thereby preventing loosening occurred in the coordination between the first cylinder 523 and the first pierced hole 32. As a result, the electrical conduction of the electrical connecting device is improved.

Figure 6:
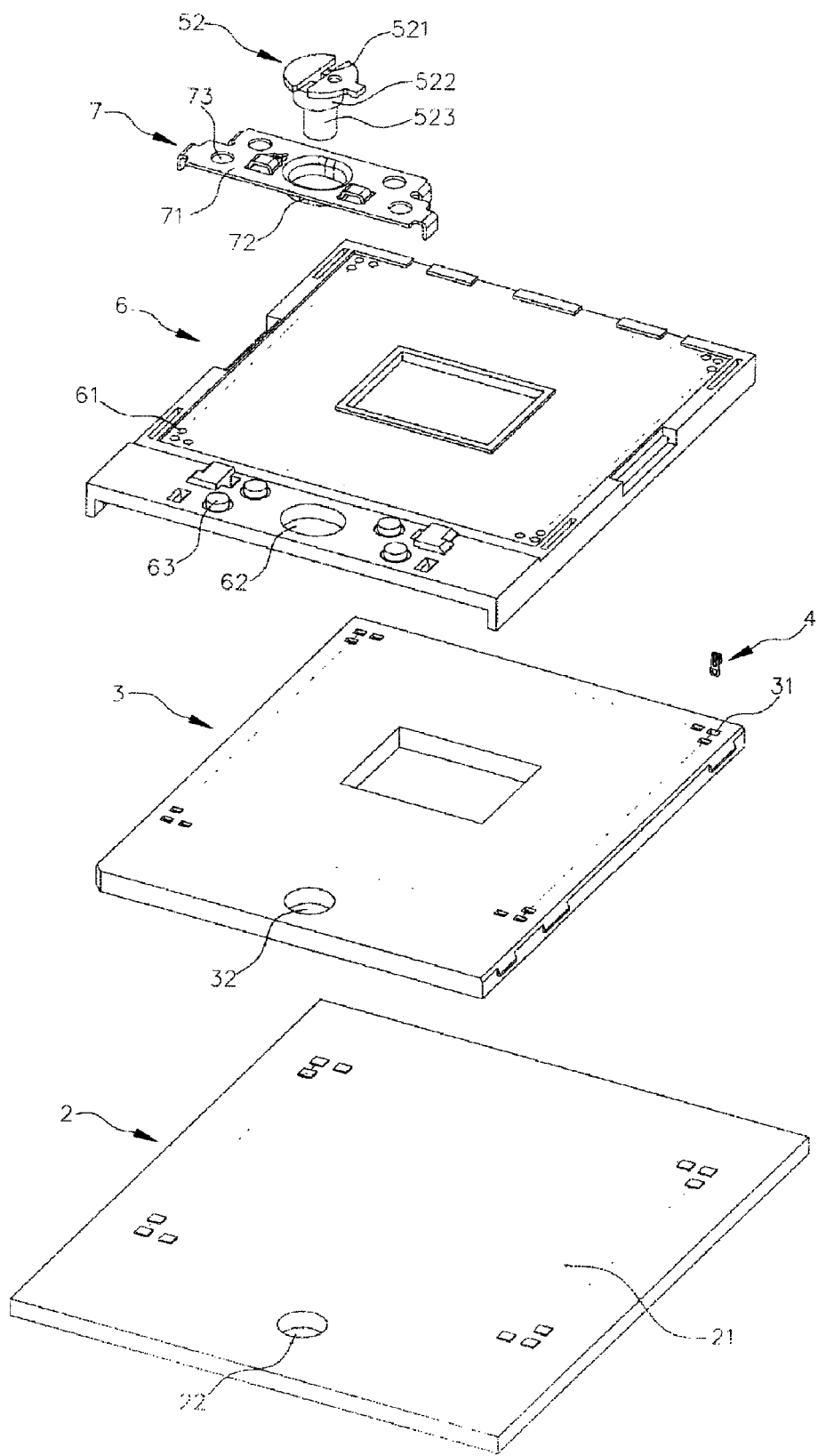
FIG. 6 is an exploded view of the electrical connecting device of another embodiment of this invention.
Figure 7:
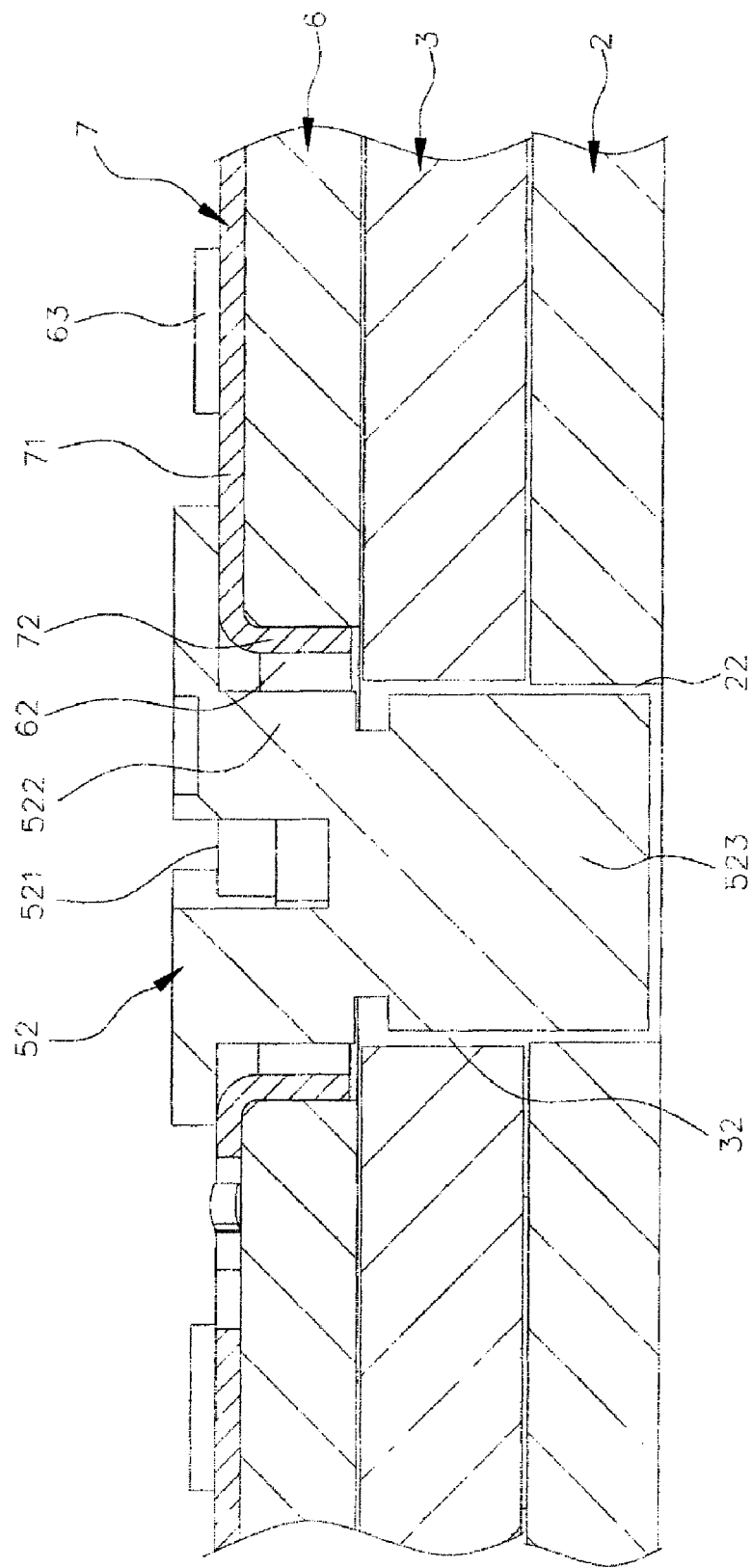
FIG. 7 is a partial cross-sectional view of the electrical connecting device of another embodiment after assembling.

In another embodiment, with reference to FIG. 6 and FIG. 7, the driving mechanism 5 of the electrical connecting device does not include the metal bushing 51. The cam 52 passes through the sleeve 72, the second pierced hole 62, the first pierced hole 32 and the through hole 22 orderly. The first cylinder 523 extends into the through hole 22 and the first pierced hole 32. The second cylinder 522 is disposed inside the sleeve 72 and rotatably cooperates with the second pierced hole 62.

When operating, by rotating the driven portion 521 with the driving tool, such as a screwdriver, the second cylinder 522 is able to push the cover 6 to slide and the cam 52 rotated by the driving tool (not shown in the figure) drives the cover 6 to move between an opened position and a closed position. When the cover 6 is at the opened position, the pins 11 contact the terminal sets 4 (that is, zero-contact state). When the cover 6 is at the closed position, the pins 11 are electrically conducted to the terminal sets 4. At this very moment when the pins 11 electrically conducted to the terminal sets 4, the pins 11 exert an acting force on the terminal sets 4, and meanwhile the pins 11 also experience a reaction force applied by the terminal sets 4. Moreover, because the pins 11 pass through the opening holes 61 of the cover 6 while the second cylinder 522 interacts with the cover 6, the reaction force will apply on the second cylinder 522. Furthermore, the first cylinder 523 is extending from the second cylinder 522, that is, the first cylinder 523 experiences a reaction force with equal amount and in opposite direction compared to the second cylinder 522. In addition, the first cylinder 523 is covered into the through hole 22, so the reaction force further applies on the through hole 22. Yet, because the through hole 22 is formed on the circuit board 2, a part of the reaction force of the plurality of terminal sets 4 exerting on the through hole 22 is borne by the through hole 22 and is transferred to the circuit board 2 through the through hole 22. As a result, the reaction force borne by the insulation base 3 is relieved, thereby preventing the bulging effect appear in the front side of the insulation base 3 and enhancing the stableness of the electrical connection of the electrical connecting device.

In conclusion, the electrical connecting device of the present invention has the following beneficial effect:

1. Different parts of the metal bushing are disposed into the first pierced hole and the through hole respectively. In addition, the cam has the driven portion extended to form a first cylinder into the first pierced hole and the through hole of the circuit board while the first cylinder further joins into the metal bushing. Therefore, during the operating process, a part of the reaction force of the terminal sets exerting on the metal bushing is borne by the metal bushing and is transferred to the circuit board. As a result, the reaction force borne by the insulation base is relieved, thereby preventing the bulging effect appear in the front side of the insulation base and enhancing the stableness of the electrical connection of the electrical connecting device.

2. By joining the first cylinder into the metal bushing, direct contact between the first cylinder and the first pierced hole is prevented. When the force rotating the cam is getting bigger, most of the reaction force of the terminal sets 4 is applied on the metal bushing and transferred to the circuit board through the metal bushing. Therefore, wearing of the first pierced hole is prevented and thereby preventing loosening occurred in the coordination between the first cylinder and the first pierced hole. As a result, the electrical conduction of the electrical connecting device is improved.

3. The plate body is extending in the lateral direction from the lateral side of the metal bushing and is disposed between the insulation base and the circuit board but not welding to the circuit board. By this configuration, the assembly of the electrical connecting device is facilitated.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An electrical connecting device adapted to receive a chip unit, the chip unit having a plurality of pins disposed on a bottom of the chip unit, the electrical connecting device comprising:
    an insulation base, formed with a terminal area and a first pierced hole;
    a terminal set, disposed correspondingly on the terminal area;
    a circuit board, disposed under the insulation base and formed with a pad area and a through hole, the pad area being disposed correspondingly to and under the terminal area for the terminal set to be soldered on, the through hole being formed correspondingly to the first pierced hole;
    a cover, horizontally and slidably covering the insulation base, adapted to receive the chip unit and formed with a plurality of opening holes and a second pierced hole, the plurality of opening holes being formed correspondingly to the terminal area for the pins to pass through and electrically connected to the terminal set: and
    a driving mechanism, having a metal bushing and a cam, the metal bushing being covered into the first pierced hole and the through hole, the cam having a driven portion extending to form a first cylinder into the first pierced hole, the first cylinder being jointed into the metal bushing correspondingly, a second cylinder off-centered with respect to the first cylinder being formed between the driven portion and the first cylinder and entering the second pierced hole.

2. The electrical connecting device of claim 1, wherein the metal bushing is extending to form a plate body in a lateral direction, and the plate body is disposed between the insulation base and the circuit board.

3. The electrical connecting device of claim 2, wherein a bottom surface of the insulation base is concave upward to form a recess to accommodate the plate body.

4. The electrical connecting device of claim 1, wherein the first cylinder penetrates through the first pierced hole and further penetrates into the through hole, and the first cylinder is not protruding from the bottom of the circuit board.

5. The electrical connecting device of claim 1, further comprising a reinforcement element, disposed on the cover with a sleeve extending downward into the second pierced hole, the second cylinder being disposed inside the sleeve, the sleeve being adapted to be pushed by the second cylinder.

6. The electrical connecting device of claim 5, wherein the reinforcement element further has a sustaining plate disposed between the driven portion and the cover for the driven portion to lean against, and opens downward to form the sleeve.

7. An electrical connecting device, comprising:
    an insulation base, formed with a first pierced hole;
    a terminal set, disposed correspondingly in the insulation base;
    a cover, horizontally and slidably covering the insulation base and formed with a second pierced hole correspondingly to the first pierced hole;
    a circuit board, disposed under the insulation base for the terminal set to be soldered on, and formed with a through hole correspondingly to the first pierced hole; and
    a driving mechanism, at least having a cam, the cam entering the second pierced hole, the first pierced hole and the through hole orderly, wherein the driving mechanism further has a metal bushing disposed inside the first pierced hole and the through hole, wherein the metal bushing extends in a lateral direction to form a plate body, and the plate body is disposed between the insulation base and the circuit board.

8. The electrical connecting device of claim 7, wherein a bottom surface of the insulation base is concaved upward to form a recess to accommodate the plate body.

9. The electrical connecting device of claim 7, wherein the cam has a driven portion, the driven portion extends to form a first cylinder, the first cylinder enters the first pierced hole and is jointed into the metal bushing a second cylinder off-centered with respect to the first cylinder is formed between the driven portion and the first cylinder, and the second cylinder enters the second pierced hole.

10. The electrical connecting device of claim 9, wherein the first cylinder penetrates the first pierced hole and further penetrates into the through hole, while the first cylinder is not protruded from the bottom of the circuit board.

11. The electrical connecting device of claim 9, wherein the cam further has a reinforcement element disposed on the cover, the reinforcement element has a sleeve extending downward into the second pierced hole, the second cylinder is disposed inside the sleeve, and the sleeve is adapted to be pushed by the second cylinder.

12. The electrical connecting device of claim 11, wherein the reinforcement element further has a sustaining plate disposed between the driven portion and the cover for the driven portion to lean against, and the sustaining plate opens downward to form the sleeve.

* * * * *